(12) United States Patent
Gans

(10) Patent No.: US 10,394,473 B2
(45) Date of Patent: *Aug. 27, 2019

(54) APPARATUSES AND METHODS FOR ARBITRATING A SHARED TERMINAL FOR CALIBRATION OF AN IMPEDANCE TERMINATION

(71) Applicant: MICRON TECHNOLOGY, INC., Boise, ID (US)

(72) Inventor: Dean Gans, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 131 days.

This patent is subject to a terminal disclaimer.

(21) Appl. No.: 15/683,540

(22) Filed: Aug. 22, 2017

(65) Prior Publication Data

US 2017/0351451 A1 Dec. 7, 2017

Related U.S. Application Data

(63) Continuation of application No. 14/883,454, filed on Oct. 14, 2015, now Pat. No. 9,766,831.

(51) Int. Cl.
*G06F 13/36* (2006.01)
*G11C 7/00* (2006.01)
(Continued)

(52) U.S. Cl.
CPC .......... *G06F 3/0629* (2013.01); *G06F 3/0604* (2013.01); *G06F 3/0683* (2013.01);
(Continued)

(58) Field of Classification Search
None
See application file for complete search history.

(56) References Cited

U.S. PATENT DOCUMENTS 4,511,959 A 4/1985 Nicolas et al.
4,745,548 A 5/1988 Blahut
(Continued)

FOREIGN PATENT DOCUMENTS

JP 2009237678 A 10/2009
KR 20070036578 A 4/2007
(Continued)

OTHER PUBLICATIONS

U.S. Appl. No. 16/008,955, titled "Apparatuses and Methods for Identifying Memory Devices of a Semiconductor Device Sharing an External Resistance" filed Jun. 14, 2018; pp. all.

(Continued)

*Primary Examiner* — Kaushikkumar M Patel
(74) *Attorney, Agent, or Firm* — Dorsey & Whitney LLP

(57) ABSTRACT

An arbitration system and method is disclosed. The apparatus includes a first and a second memory devices, and a resistor coupled in common to the first and second memory devices, the first memory device includes a first calibration circuit configured to perform a first calibration operation responsive, at least in part, to an external calibration command, the first calibration operation being performed based on the resistor, and the second memory device includes a second calibration circuit configured to perform a second calibration operation responsive, at least in part, to the external calibration command, the second calibration operation being performed based on the resistor after the first calibration operation has finished.

18 Claims, 10 Drawing Sheets

(51) Int. Cl.
  *G06F 3/06* (2006.01)
  *G06F 13/368* (2006.01)
  *G11C 7/10* (2006.01)
  *G06F 13/16* (2006.01)
(52) U.S. Cl.
  CPC ........ *G06F 13/1668* (2013.01); *G06F 13/368* (2013.01); *G11C 7/1051* (2013.01); *G11C 2207/2254* (2013.01)

(56) References Cited

U.S. PATENT DOCUMENTS

| | | | |
|---|---|---|---|
| 4,986,183 | A | 1/1991 | Jacob et al. |
| 6,661,860 | B1 | 12/2003 | Gutnik et al. |
| 6,836,144 | B1 | 12/2004 | Bui et al. |
| 7,039,824 | B2 | 5/2006 | Simon et al. |
| 7,215,128 | B2 | 5/2007 | Fujisawa |
| 7,269,043 | B2 | 9/2007 | Lee |
| 7,432,731 | B2 | 10/2008 | Bains et al. |
| 7,436,202 | B2 | 10/2008 | Lin et al. |
| 7,443,193 | B1 | 10/2008 | Santurkar et al. |
| 7,973,553 | B1 | 7/2011 | Wang et al. |
| 7,990,174 | B2 | 8/2011 | Park |
| 9,318,183 | B2 | 4/2016 | Ware et al. |
| 9,531,382 | B1 | 12/2016 | Miwa et al. |
| 9,666,245 | B2 | 5/2017 | Arai et al. |
| 9,711,189 | B1 | 7/2017 | Wang et al. |
| 9,740,269 | B1 | 8/2017 | Tatapudi et al. |
| 9,766,831 | B2 | 9/2017 | Gans |
| 9,767,921 | B1 | 9/2017 | Pan |
| 10,090,064 | B2 | 10/2018 | Pan |
| 10,193,711 | B2 | 1/2019 | Wieduwilt et al. |
| 10,205,451 | B1 | 2/2019 | Johnson |
| 2003/0126356 | A1 | 7/2003 | Gustavson et al. |
| 2003/0235084 | A1 | 12/2003 | Zumkehr et al. |
| 2004/0128429 | A1 | 7/2004 | Khandekar et al. |
| 2004/0174185 | A1 | 9/2004 | Lin et al. |
| 2004/0240255 | A1 | 12/2004 | Smith et al. |
| 2005/0040845 | A1 | 2/2005 | Park |
| 2005/0226080 | A1 | 10/2005 | Lee |
| 2006/0158198 | A1 | 7/2006 | Fujisawa |
| 2008/0054935 | A1 | 3/2008 | Pan |
| 2008/0068040 | A1 | 3/2008 | Morishima et al. |
| 2008/0198666 | A1 | 8/2008 | Nygren |
| 2009/0009212 | A1 | 1/2009 | Brox |
| 2009/0224802 | A1 | 9/2009 | Hollis et al. |
| 2011/0128038 | A1 | 6/2011 | Ko |
| 2011/0283060 | A1 | 11/2011 | Ware et al. |
| 2013/0015880 | A1 | 1/2013 | Haraguchi |
| 2013/0036253 | A1 | 2/2013 | Baltar |
| 2013/0066253 | A1 | 3/2013 | Bertrand et al. |
| 2013/0088257 | A1 | 4/2013 | Hara |
| 2013/0113517 | A1 | 5/2013 | Ko |
| 2013/0311717 | A1 | 11/2013 | Kim et al. |
| 2013/0335114 | A1 | 12/2013 | Chen et al. |
| 2014/0097911 | A1 | 4/2014 | Kaiwa et al. |
| 2014/0185384 | A1 | 7/2014 | Kim et al. |
| 2014/0185401 | A1 | 7/2014 | Yang et al. |
| 2015/0019831 | A1 | 1/2015 | Van Huben et al. |
| 2015/0067292 | A1 | 3/2015 | Grunzke |
| 2015/0270010 | A1 | 9/2015 | Kang |
| 2015/0340069 | A1 | 11/2015 | Arai et al. |
| 2015/0364177 | A1 | 12/2015 | Lee |
| 2016/0042769 | A1 | 2/2016 | Moran |
| 2017/0109091 | A1 | 4/2017 | Gans |
| 2017/0109249 | A1 | 4/2017 | Tatapudi et al. |
| 2017/0162238 | A1 | 6/2017 | Lee et al. |
| 2017/0228010 | A1 | 8/2017 | Tatapudi et al. |
| 2018/0167055 | A1 | 6/2018 | Gans |
| 2018/0190368 | A1 | 7/2018 | Pan |
| 2018/0375692 | A1 | 12/2018 | Wieduwilt et al. |
| 2019/0036740 | A1 | 1/2019 | Wieduwilt et al. |
| 2019/0131972 | A1 | 5/2019 | Gans |

FOREIGN PATENT DOCUMENTS

| | | |
|---|---|---|
| KR | 1020070088845 A | 8/2007 |
| KR | 1020080002692 A | 1/2008 |
| KR | 1020120087662 A | 8/2012 |
| TW | 201225079 A | 6/2012 |
| TW | 201532051 A | 8/2015 |
| TW | 201640358 A | 11/2016 |
| WO | 2010144624 A1 | 12/2010 |
| WO | 2017066161 A1 | 4/2017 |
| WO | 2018107076 A1 | 6/2018 |
| WO | 2018125293 A1 | 7/2018 |
| WO | 2018237272 A1 | 12/2018 |

OTHER PUBLICATIONS

U.S. Appl. No. 16/034,233, titled "Methods and Apparatuses for Dynamic Step Size for Impedance Calibration of a Semiconductor Device" filed Jul. 12, 2018, pp. all.

U.S. Appl. No. 15/683,439, entitled: "Timing Based Arbiter Systems and Circuits For ZQ Calibration", filed on Aug. 22, 2017.

U.S. Appl. No. 15/882,723 entitled 'Methods and Apparatuses for Dynamic Step Size for Impedance Calibration of a Semiconductor Device' filed on Jan. 29, 2018.

U.S. Appl. No. 15/834,892 entitled "Apparatuses and Methods for Calibrating Adjustable Impedances of a Semiconductor Device", filed Dec. 7, 2017.

Receipt of ISR/WO dated Jan. 25, 2017 for appln No. PCT/US2016/056372.

U.S. Appl. No. 15/396,259, entitled "Timing Based Arbiter Systems and Circuits for ZQ Calibration," filed on Dec. 30, 2016.

U.S. Appl. No. 15/630,901, entitled "Timing Based Arbitration Methods and Apparatuses for Calibrating Impedances of a Semiconductor Device" filed Jun. 22, 2017.

Singh, et al., "MOUSETRAP: High-Speed Transition-Signaling Asynchronous Pipelines", IEEE Transactions on Very Large Scale Integration (VLSI) Systems, vol. 15, No. 6, Jun. 2007, 15 pages.

U.S. Appl. No. 16/146,489 titled "Timing Based Arbitration Methods and Apparatuses for Calibrating Impedances of a Semiconductor Device", filed on Sep. 28, 2018.

Extended European Search Report dated Apr. 11, 2019 for European application No. 16856025.8.

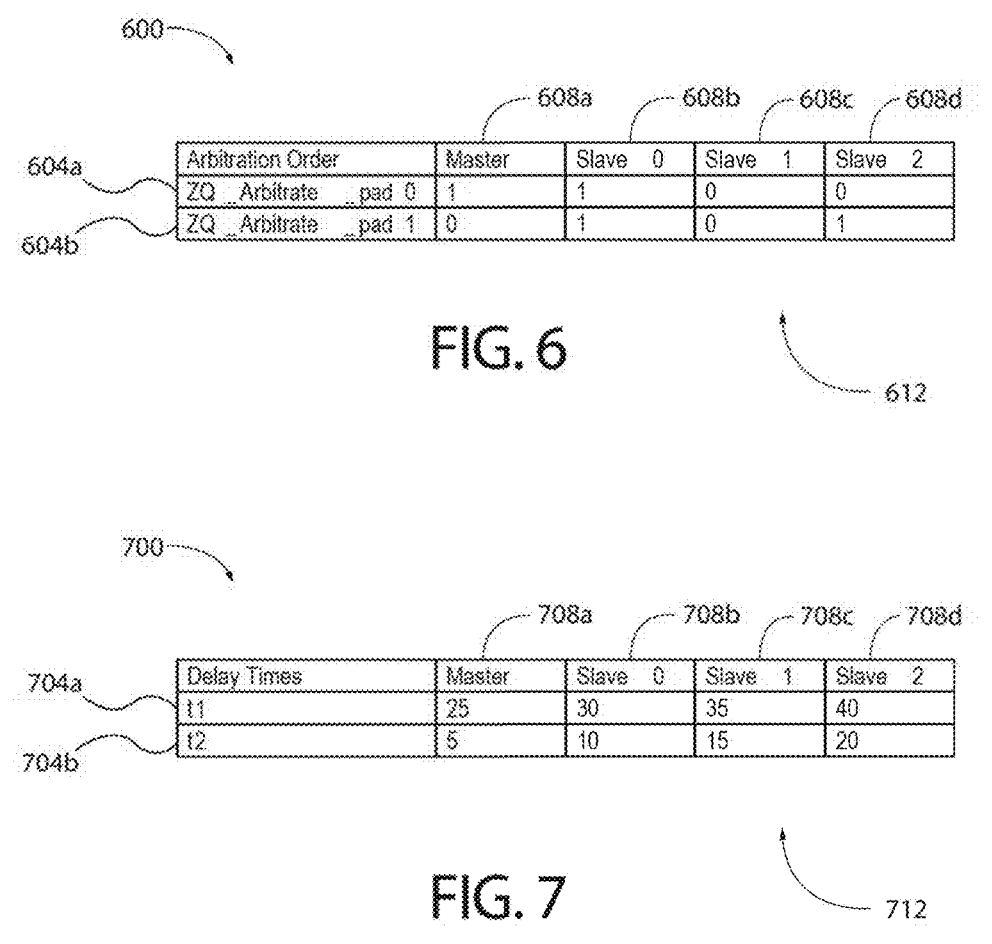

| Arbitration Order | Master | Slave 0 | Slave 1 | Slave 2 |
|---|---|---|---|---|
| ZQ_Arbitrate_pad 0 | 1 | 1 | 0 | 0 |
| ZQ_Arbitrate_pad 1 | 0 | 1 | 0 | 1 |

FIG. 6

| Delay Times | Master | Slave 0 | Slave 1 | Slave 2 |
|---|---|---|---|---|
| t1 | 25 | 30 | 35 | 40 |
| t2 | 5 | 10 | 15 | 20 |

APPARATUSES AND METHODS FOR ARBITRATING A SHARED TERMINAL FOR CALIBRATION OF AN IMPEDANCE TERMINATION

CROSS-REFERENCE TO RELATED APPLICATION

This application is a continuation of U.S. patent application Ser. No. 14/883,454, filed Oct. 14, 2015. This application is incorporated by reference herein in its entirety and for all purposes.

TECHNICAL FIELD

The present disclosure is directed to systems and methods for mitigating contention that may occur in a semiconductor memory device on an external resistor pin when multiple memory devices attempt to use the pin for a calibration operation of a resistive termination.

BACKGROUND

Semiconductor devices, such as memory devices and processors, transmit data across data communication lines that are configured to have carefully matched impedance values. Variations in certain operating parameters such as temperature or the like can result in impedance mismatches that can adversely affect data transmission rates and quality. In order to mitigate these adverse scenarios, memory device may include programmable termination components that have impedance values that can be adjusted as operating conditions change. In some implementations, programmable termination components are calibrated based on voltage measurements made on a circuit node that connects to an external resistor. In some cases, a limited number of external connections are available for connection to an external resistor. These external connections may be shared between multiple devices that use the connection for calibration purposes. Thus, contention for use of the external connection may arise when two or more devices attempt to concurrently use the external connection for a calibration operation.

BRIEF DESCRIPTION OF THE DRAWINGS

FIG. 6 is a table that shows an example arbitration order for a memory that includes four memory devices connected in common to one calibration resistor.

FIG. 7 is a table that shows example delay times for a memory that includes four memory devices connected in common to one calibration resistor.

DETAILED DESCRIPTION

Figure 1:
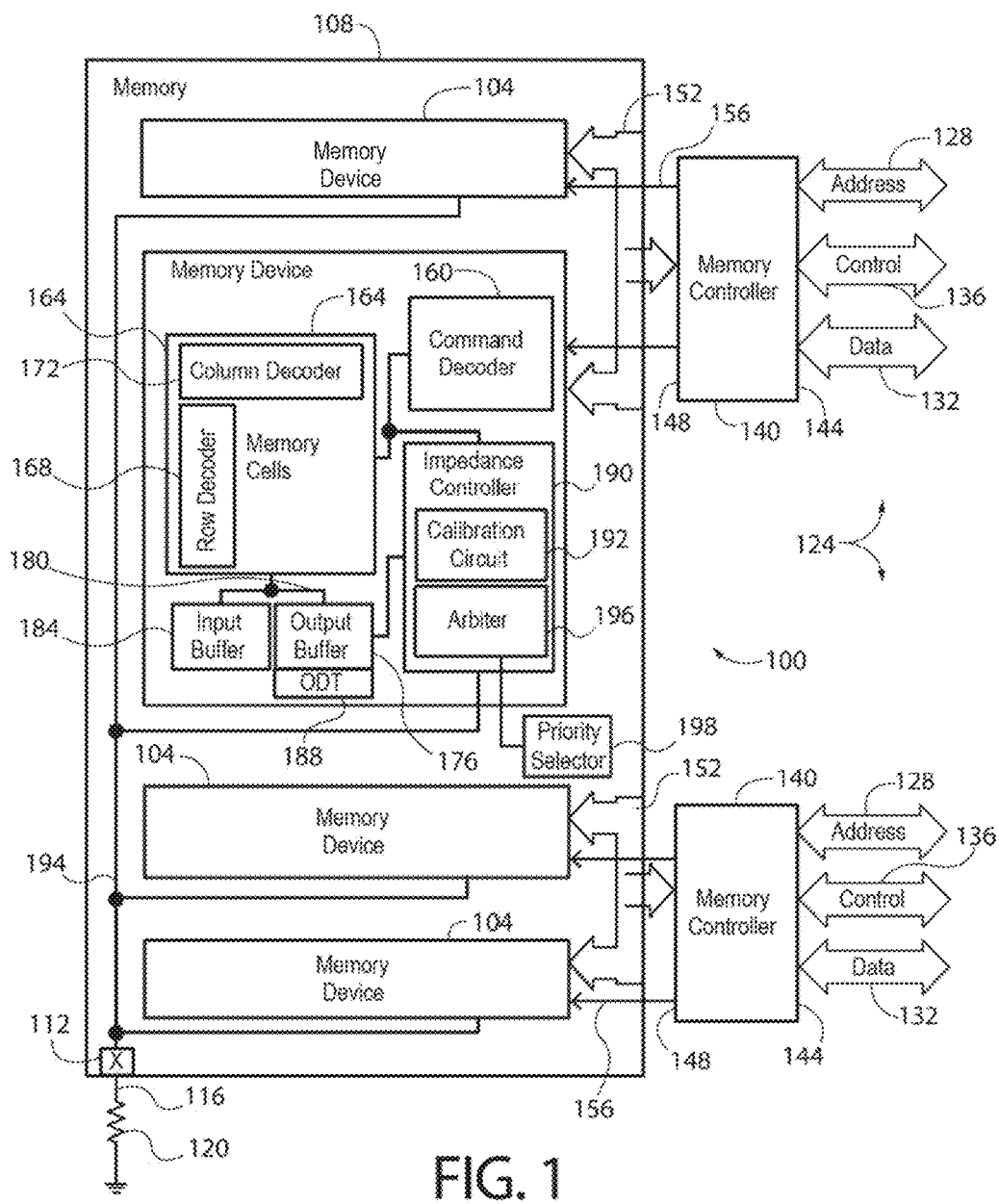
FIG. 1 is block diagram of a semiconductor device in accordance with the present disclosure.

FIG. 1 is block diagram of a semiconductor device in accordance with the present disclosure. Referring to FIG. 1, the semiconductor device of the present disclosure will be described with reference to a semiconductor memory 100, by way of example and not limitation. The memory 100 may be a volatile memory such as a SRAM or DRAM, or a non-volatile memory such as a FLASH memory or a ferroelectric memory. In one embodiment, the Double Data Rate (DDR) memory, such as a Low Power Double Data Rate 4 (LPDDR4) memory. In accordance with various embodiments, the semiconductor memory 100 may include a plurality of individual memory devices 104 that may be arranged on one or more different semiconductor dies.

The semiconductor memory 100 may include a package 108 that contains and interconnects the various individual memory devices 104. The package 108 may provide a plurality of external pins that connect to contact pads arranged on the interior of the package 108. The pins and pads may provide electrical connections such as between the memory devices 104 and the larger system to which the memory 100 is connected. As shown in FIG. 1, the memory 100 may include an internal pad, which may be referred to as the ZQ pad 112, and a corresponding external pin, which may be referred to as the ZQ pin 116. An external resistor, which may be referred to as the ZQ resistor 120, may connect to the ZQ pad 112 through the ZQ pin 116. One or more of the individual memory devices 104 may use the ZQ resistor 120 in an impedance calibration process, which is described in greater detail below.

The semiconductor memory 100 may be arranged as a component of a computing device such as a laptop computer, a desktop computer, a cellular or other mobile device, a tablet computer, personal digital assistant, and so on. The memory 100 may be mounted in an appropriate memory slot or otherwise interconnected with the computing device such that communication may take place through the pins on the external packaging of the memory 108. A computing device that includes the memory 100 may generally include one or more processors (not shown in FIG. 1). The processor or processors may be single core or multi-core in various implementations. Typically, the memory 100 functions as a passive device in the larger system, receiving and executing commands received from a processor or processor core. Here, the computing device may include a bus interface 124 across which the memory device 100 and the processor or processor cores may communicate. As shown in FIG. 1, the bus interface 124 may include an address bus 128, a data bus 132, and a control bus 136. FIG. 1 shows these various buses as separate components by way of example and not limitation. In some instances, the bus interface 124 may multiplex certain of these separate buses. For example, in some implementations, the address bus 128 and the control bus 136 may be time division multiplexed such that these buses use the same physical lines in different time slices.

The memory device 100 may be associated with one or more memory controllers 140 that are configured to provide data communication to and from the memory device 100.

The memory controller 140 may include a front end 144 that communicates across the bus interface 124. Similarly, the memory controller 140 may include a back end 148 that communicates with the memory device 100. Each memory controller 140 may communicate across a separate memory bus 152 that connects the back end 148 of the memory controller 140 to one or more the individual memory devices 104 associated with the memory 100. Each memory bus 152 associated with a given controller 140 may include address, data, and control lines that are connected in common between the various memory devices 104 with which the controller 140 communicates. Each memory bus 152 may additionally include individual chip select lines 156 that may be selectively asserted to enable one of the memory devices 104 to send or receive data across the common address, data, and control lines. Through the combination of individual chip select lines 156 and common address, data, and control lines, a memory bus 152 associated with a given controller 140 provides separate communication pathways between the controller and each of the various memory devices 104 with which the controller 140 communicates.

In operation, a processor or processor core sends a command to the memory 100 by first sending the command across the bus interface 124. A memory controller 140 receives the command from across the bus interface 124 and routes the command to the appropriate memory device 104 on the memory 100. Here, the memory controller 140 asserts the appropriate chip select line 156 and sends the command across the common address, data, and control lines of the memory bus 152. The appropriate memory device 104 receives the command from the memory controller 140 and initially processes the command through the operation of a command decoder 160. The command decoder 160 may be configured to recognize a plurality of commands that correspond to various operations that may be executed by the memory device 104. In the following discussion, certain commands, such as a read/write command and a calibration command, are each described in detail in order to more particularly illustrate certain embodiments of the present disclosure. It should be appreciated, however, that the command decoder 160 is generally configured to recognize and decode a number of commands that are not specifically discussed herein. Discussion of those various commands and illustration in the drawings of specific components related to those commands are omitted for the sake of clarity and brevity.

In some instances, the command decoder 160 may receive, decode, and process a read/write command. A read/write command generally directs the memory device 104 to read or write data to or from one or more memory cells in a memory array 164 associated with the memory device 104. In processing the read/write command, the command decoder 160 may provide internal control signals to read data from and write data to the memory array 164. Row and column address signals may be provided (e.g., applied) to an address latch in the memory device 104 through an address bus. The address latch may then provide (e.g., output) a separate column address and a separate row address. The address latch may provide row and column addresses to a row address decoder 168 and a column address decoder 172, respectively. The column address decoder 172 may select signal lines extending through the array 164 corresponding to respective column addresses. The row address decoder 168 may be coupled to a signal line driver that activates respective rows of memory cells in the array 164 corresponding to received row addresses. The selected signal line or lines corresponding to a received column address may be coupled to a read/write circuitry to provide read data to an output data buffer 176 via an input-output data path 180. Write data may be provided to the memory array 164 through an input data buffer 184 and the memory array read/write circuitry. A clock generator may provide an internal clock signal responsive to an input clock signal. The internal clock signal may be used by circuits of the memory, for example, the output data buffer 176 and the input data buffer 184.

In other instances, the command may be a calibration command. A calibration command is generally issued to cause a memory device 104 to calibrate an impedance of each of programmable termination component 188, sometimes referred to as On Die Termination (ODT) and the output buffer 176. As known, an ODT circuit may be adjusted to provide a matched impedance. In FIG. 1, the programmable impedance termination component 188 is depicted independently of the output buffer 176. However, it is also possible that the output buffer includes the programmable impedance termination component 188 as a part of the output buffer. In this case, the ODT operation is performed by at least a part of the output buffer. Upon receipt, the command decoder 172 routes the calibration command to an impedance controller 190, which generally operates to adjust impedances of the programmable impedance termination component 188 and the output buffer 176. Each of the programmable termination component 188 and the output buffer 176 generally includes a group of pull-up and pull-down transistors that are controlled to be enabled or disabled by the impedance controller 190. The impedance controller 190 enables/disables the pull-up and pull-down transistors on or off so that the impedance of the output buffer matches the impedance of the data bus. In this way, signal reflections that result from impedance mismatches are avoided.

The calibration circuit 192 generally operates by measuring the voltage at the ZQ pad 112 and using that voltage to adjust the impedance of the programmable impedance termination component 188 and the output buffer 176. When current is sunk from the ZQ resistor 120 as part of a calibration command, the current may be generated by the calibration circuit. The impedance of the ZQ resistor 120 represents the impedance that each of the programmable impedance termination component 188 and the output buffer 176 sees on the data bus to which it is coupled. This impedance of each of the programmable impedance termination component 18 and the output buffer 176 may vary as various operating conditions change. For example, temperature changes that occur during the operation of the memory 100 may lead to variations in these impedances. By measuring the impedance on the resistor 120, of which impedance is basically stable regardless of changes in conditions, the calibration circuit 192 makes an impedance measurement that corresponds to current operating conditions. This impedance measurement may then be used to set the impedance value of each of the programmable termination component 188 and the output buffer 176 such that it matches current operating conditions. For example, the calibration circuit 192 may measure the voltage at the ZQ pad 112 and compare that voltage to an internal reference voltage. This comparison may be made through the operation of a comparator that outputs a comparison result. The comparison result may then be used to step up or step down the voltage at the ZQ pad 112 so as to bring the ZQ pin 116 voltage closer to the reference voltage. This comparison process generates control codes that may be used to enable/disable the various pull down and pull up transistors associated with the programmable termination component 188 and the output buffer 176 to adjust their impedances properly. This process generally operates to match the output buffer 176 impedance with the external impedance that is represented by the ZQ resistor 120.

As can be seen in FIG. 1, the ZQ pad 112 may be shared between multiple memory devices 104. Here, each impedance controller 190 may be connected to a common signal line, referred to herein as the calibration bus 194. As can be seen in FIG. 1, the calibration bus may connect the ZQ pad 112 to at least a first and second impedance controller 190. Because the first and second memory devices 104 are connected to a single calibration bus 194, contention on the ZQ pin 116 may occur in the event that the first and second memory both devices 104 perform respective calibration operations concurrently. In the configuration of FIG. 1 where the first and second memory devices 104 communicate with separate memory controllers 140, it may be the case that the controllers 140 are not generally configured to communicate with each other. Stated another way, one memory controller 104 may not necessarily know what the other memory controller 140 is doing. Thus, both memory controllers 140 may issue calibration commands to their respective memory devices 104 to concurrently perform respective calibration operations, and the memory devices 104 may then respond by concurrently attempting to calibrate using the ZQ pad 112. This contention for the ZQ resistor may be resolved through the operation of an arbiter circuit 196 in accordance with the present disclosure.

An arbiter circuit 196 generally operates by using the same ZQ pad 112 that is used in the calibration process itself to determine whether or not other memory devices 104 are simultaneously using or attempting to use the ZQ pad 112 for calibration. In this regard, each of the arbiter circuits 196 that are connected to the same calibration bus 194 implement an arbitration protocol that allows the various arbiter circuit 196 to take control of the calibration bus 194 to the exclusion of the other arbiter circuits 196 in a predictable manner. The arbitration protocol implemented by the various arbiter circuits 196 may define a different arbitration priority for each arbiter circuit 196 that can potentially participate in the arbitration. The arbitration priority may dictate the manner in which a particular arbiter circuit 196 behaves when it attempts to monitor and take control of the ZQ pad 112. A particular arbiter circuit 196 may discover its arbitration priority through one or more inputs that are provided to the arbiter circuit 196. As shown in FIG. 1, these inputs are generally referred to as priority selectors and are identified with reference numeral 198.

The arbitration priority assigned to a particular memory device 104 and the manner in which this information is conveyed to the arbiter circuit 196 may depend on a number of factors including the number of memory devices 104 that are connected to the same calibration bus 194. In some cases, only two memory devices 104 may be connected to a particular calibration bus 194. In this implementation, one of the memory devices 104 may be regarded as a arbitration bus master and the other memory device 104 may be regarded as an arbitration bus slave. In this implementation, the priority selector 198 may be a single input that provides either a high or low signal indicating either that the memory device is an arbitration bus master or a bus slave. The type of priority selector 198 may be used for example in the configuration of FIG. 2 where an ODT pin provides a voltage input that the memory device uses to determine its priority within the arbitration protocol. In other embodiments where more than two memory devices 104 are coupled to the same calibration bus 194, multiple priority selector inputs may be provided so as to designate a greater number of arbitration protocol priority designations. This type of priority selector 198 may be used for example in the configuration of FIG. 5 where multiple input lines provide a data input in the form a digital code that is stored in the memory and used by the memory device to discover its arbitration protocol priority designation. FIG. 1 shows four memory devices 104 connected to a single calibration bus 194 by way of example and not limitation. As described in greater detail below, various implementations in accordance with the present disclosure may include different numbers of calibration buses 194 and/or different numbers of memory devices 104 coupled thereto.

Figure 2:
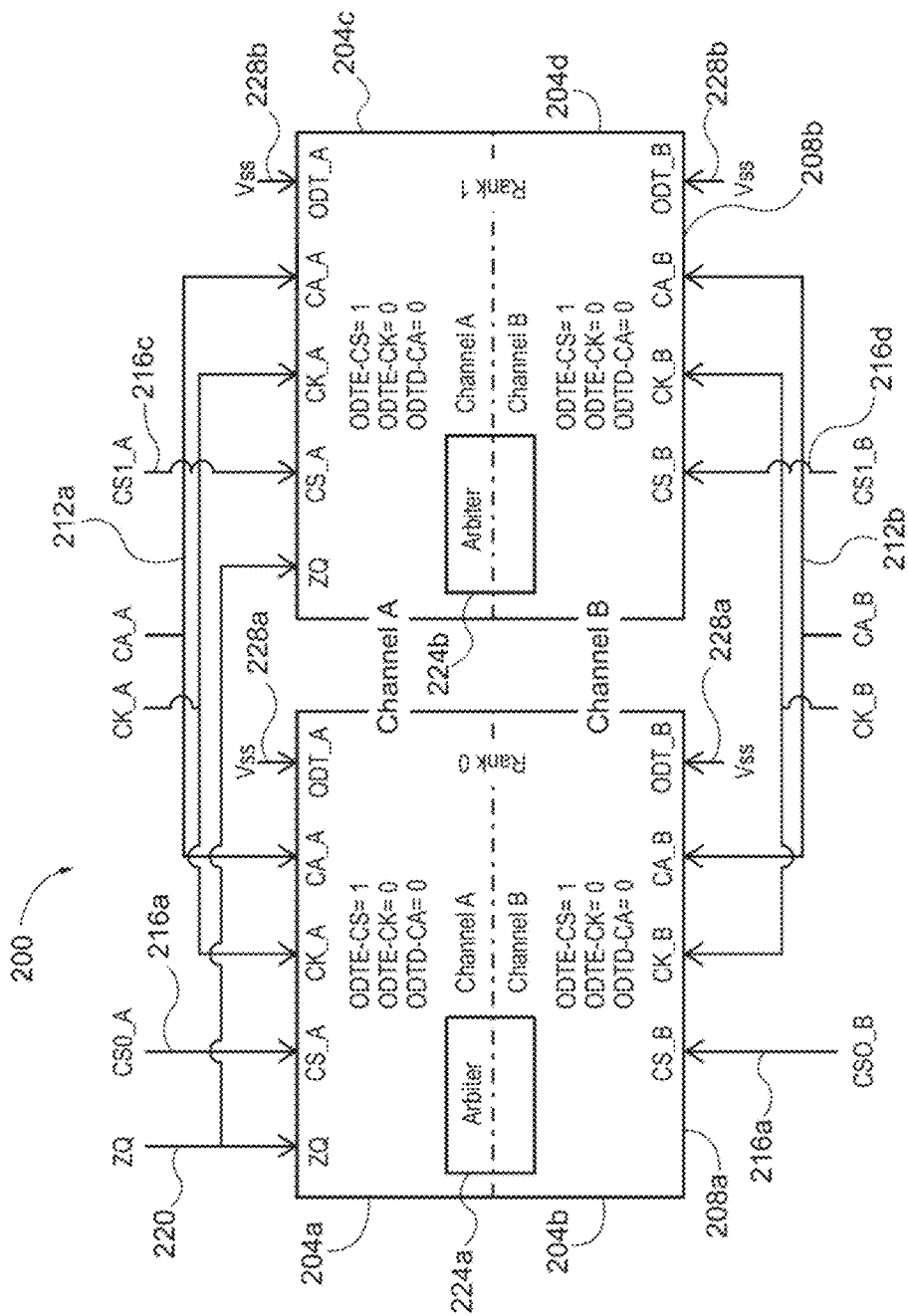
FIG. 2 is an example memory that includes a plurality of memory devices in accordance with the present disclosure.

FIG. 2 is an example memory 200 that includes two memory devices 208*a-b* in a two channel, two rank configuration. Each of the memory devices 208*a-b* may be implemented by the memory device 104 previously described with reference to FIG. 1. The memory 200 shown in FIG. 2 includes a first channel labelled as "Channel A" and a second channel labelled as "Channel B." Both Channel A and Channel B include a first rank labelled "Rank 0" and a second rank labelled "Rank 1." Channel A is generally associated with a first controller that is configured to communicate across a common command and address bus 212*a* with either Rank 0 or Rank 1. Similarly, Channel B may be associated with a second controller that is configured to communicate across a common command and address bus 212*b* with either Rank 0 or Rank 1. The controllers associated with the channels of the memory 200 select the rank to which data is to be transmitted or received through chip select lines 216*a-d* that connect to the two respective memory devices 208*a-b*.

The example memory 200 of FIG. 2 includes two separate memory devices 208*a-b*. Each memory device 208*a-b* is arranged in a dual channel configuration such that each includes two memory channels. The first memory device 208*a* includes two memory channels 204*a-b*. Similarly, the second memory device 208*b* includes two memory channels 204*c-d*. As can be seen in FIG. 2, the first memory device 208*a* implements Rank 0 for both Channel A and Channel B (e.g., channels 204*a-b*). Similarly, the second memory device 208*b* implements Rank 1 for both Channel A and Channel B (e.g., channels 204*c-d*). As can also be seen in FIG. 2, a ZQ pin 220 is shared between the first and second memory devices 208*a-b*. This arrangement can lead to potential contention on the ZQ pin 220 when calibration commands are issued on both the Channel A and Channel B. In one example, contention for the ZQ pin 220 may occur in the event that the first controller associated with Channel A issues a calibration command on Rank 0 and the second controller associated with Channel B issues a calibration command on Rank 1. Here, it may be the case that no communication path exists between the first and second controllers and no communication path exists between the two memory devices 208*a-b*. Thus, when Channel A, Rank 0 (memory device 208*a*) attempts to take control of the ZQ pin 220, it will not have any knowledge of whether Channel B, Rank 1 (memory device 208*b*) has taken control or is attempting to take control of the ZQ pin 220. In order to resolve this potential contention, the two memory devices 208*a-b* may each include at least one arbiter circuit 224*a-b* in accordance with the present disclosure.

While not specifically shown in FIG. 2, it may be the case that a memory device 208*a-b* includes more than one arbiter. For example, the first memory device 208*a* could include two arbiter circuits: one for the Channel A memory device 208*a* and the other for the Channel B memory device 208*b*.

Here, the two arbiter circuits would arbitrate for the ZQ pin 220 to resolve a potential contention that may occur when a calibration command is received substantially simultaneously by each of memory devices 208a and 208b, or when a calibration command is received by one of memory device 208a or 208b during a calibration operation for the other of memory devices 208a and 208b. For example, potential contention may occur when a calibration command is received by the memory device 208a from the controller associated with Channel A, during a calibration operation for the memory device 208b responsive to a calibration command received from the controller associated with Channel B. Arbiter circuits 224a-b may be generally configured to resolve contention on the ZQ pin 220 that may occur under the previously described conditions. In contrast, for example, because Channel A, Rank 0 and Channel B, Rank 0 are associated with the same memory device 208a, no contention will occur if calibration commands are provided to the memory device 208a from the controllers associated with Channels A and B.

Referring again to FIG. 2, the first and second memory devices 208a-b are each assigned a protocol priority that may be specified through input provided at ODT pins 228a-b. As shown in FIG. 2, the protocol priority assignment for the first memory device 208a may be received on either the ODT_A or ODT_B pin 228a. Similarly, the protocol priority assignment for the second memory device 208b may be received on either the ODT_A or ODT_B pin 228b. Because in this implementation there is only two arbiter circuits 224a-b that arbitrate for control of the same ZQ pin 220, only two protocol priorities are needed to differentiate between the arbiter circuits 224a-b. Here, one memory device may be assigned as the arbitration bus master and the other memory device assigned as the arbitration bus slave. In one implementation, these two protocol priorities are indicated by the voltage that is present on the ODT pins 228a-b. This voltage may different for each memory device 208a-b. For example, the ODT pin 228b may be coupled to a relatively high voltage, such as a power supply voltage (e.g., Vdd2) or floated to indicate that the memory device 208b is an arbitration bus slave. Similarly, the ODT 228a pin may be coupled to a relatively low voltage, such as a reference voltage (e.g., Vss) to indicate that the memory device 208a is an arbitration bus master.

In operation, the first and second arbiter circuits 224a-b use the ZQ pin 220 in an arbitration protocol that selectively grants access to ZQ pin 220. As described in connection with FIG. 1, the ZQ pin 220 is connected to an external resistor that is used in a calibration operation executed by a calibration circuit in response to a calibration command. Thus, the same ZQ pin 220 is used in both an arbitration operation and a calibration operation, each of which is executed in response to receiving a calibration command. In configurations such as illustrated in FIG. 2 where two arbiter circuits 224a-b arbitrate for use of a ZQ pin 220 to which they are commonly connected, one arbiter circuit may be designated as the arbitration bus master and the other arbiter circuit may be designated as the arbitration bus slave. The arbitration protocol selectively grants access to the ZQ pin 220 by giving the arbitration bus master access the ZQ pin 220 in the event that the arbitration bus master attempts to take or has already taken control of the resistor during a first calibration operation when the arbitration bus slave attempts to take control of the ZQ pin 220 for use in a second calibration operation. Example operations in accordance with this two-memory device arbitration protocol that may be executed by arbiter circuits 224a-b acting as an arbitration bus master and an arbitration bus slave are illustrated respectively in FIG. 3A and FIG. 3B.

Figure 3A:
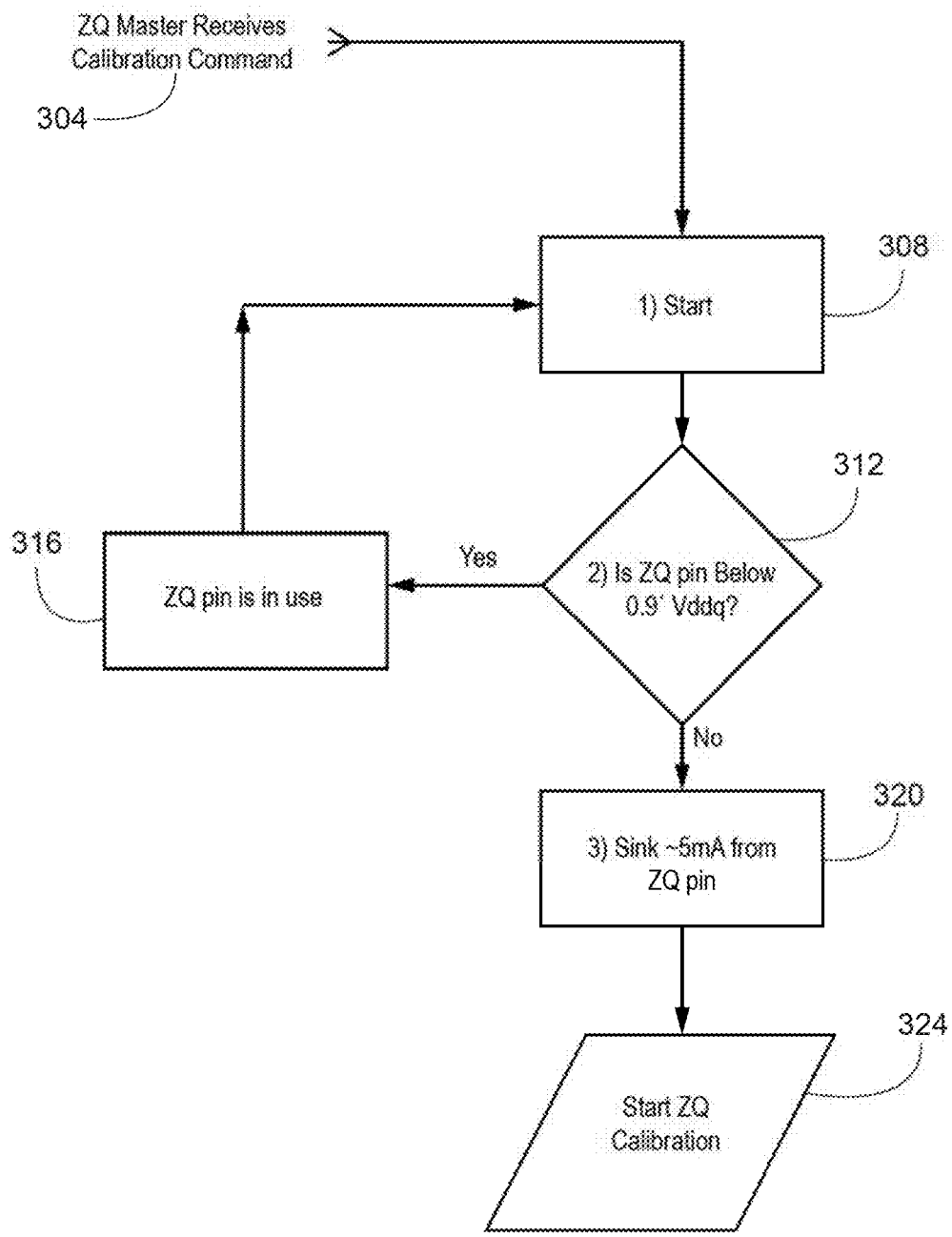
FIGS. 3A-B are flow charts that illustrate an arbitration method in accordance with the present disclosure.

Turning first to operations executed by an arbitration bus master, reference is made to FIG. 3A. The following discussion of FIG. 3A makes reference to the example configuration of FIG. 2, by way of example. FIG. 3A is a flow chart that illustrates arbitration bus master operations that may be executed by an arbiter circuit in accordance with the present disclosure that is appropriately designated as an arbitration bus master in a configuration where two memory devices are connected in common to one ZQ pin. As mentioned above, the ODT 228a pin associated with first memory device 208a may be coupled to a relatively low voltage to indicate that the memory device 208a is an arbitration bus master. Continuing with this example, the arbitration bus master operations of FIG. 3A are discussed in the context of the first arbiter circuit 224a acting as the arbitration bus master.

Initially, in operation 304, a calibration command is received by memory device 208a associated with the first arbiter circuit 224a. In the dual channel configuration of FIG. 2, the first arbiter circuit 224a is associated with both first and second memory channels 204a and 204b. Thus, in this configuration, for example, the calibration command may be initially received by the memory device 208a from either controller associated with Channels A or B. The calibration command generally instructs the memory device to which it is directed to perform a calibration operation using the ZQ resistor connected to the ZQ pin 220. Prior to executing the calibration command, the memory device 208a obtains control of ZQ pin 220 to the exclusion of other memory device associated with the memory. Thus, prior to executing the calibration command, the memory device 208a passes control to the first arbiter circuit 224a.

In operation 308, the first arbiter circuit 224a begins by monitoring the voltage of the ZQ pin 220. If the ZQ pin 220 is in use, the voltage on the ZQ pin 220 will be below a power supply voltage ($V_{dd}$). If the ZQ pin 220 is not in use, the voltage on the ZQ pin 220 will be at the power supply voltage ($V_{dd}$). More specifically, the ZQ pin 220 is at $V_{dd}$ when the ZQ pin 220 is not in use because the ZQ pin 220 may be pulled-up to $V_{dd}$ as a default. When the calibration circuit (shown in FIG. 1) measures the voltage at the ZQ pin 220 as part of the impedance matching operation, the calibration circuit is concurrently sinking some current from the ZQ pin 220. This causes the voltage at the ZQ pin 220 to fall below $V_{dd}$ by a measurable amount. When the calibration operation is finished, current is no longer sunk from the ZQ pin 220 and the voltage goes up to $V_{dd}$ responsive to the pull-up. Thus, the ZQ pin being close to $V_{dd}$ indicates that there is no calibration operation currently occurring. In order to distinguish between these two states, the first arbiter circuit 224a generally monitors the voltage on the ZQ pin 220 based on a threshold voltage that is relative to the power supply voltage. In one implementation, for example, the first arbiter circuit 224a monitors the voltage on the ZQ pin 220 based on a threshold voltage that is 90% of power supply voltage. As shown in FIG. 3A, this initial monitoring of the ZQ pin 220 is generally referred to as "state 1" of the bus master arbitration protocol. Following operation 308, operation 312 may be executed.

In operation 312, the first arbiter circuit 224a determines if the voltage on the ZQ pin 220 is below the threshold voltage. As shown in FIG. 3A, this determination operation may be generally referred to a "state 2" of the bus master arbitration protocol. If, in operation 312, the first arbiter circuit 224a determines that the voltage on the ZQ pin 220 is below the threshold voltage, operation 316 may then be executed. In operation 316, the arbiter circuit 224a determines that the ZQ pin 220 is in use. Operation 308 is then executed again following operation 316 such that voltage monitoring on the ZQ pin 220 continues. If, in operation 312, the first arbiter circuit 224a determines that the voltage on the ZQ pin 220 is equal to or above the threshold voltage, operation 320 may then be executed because the ZQ pin 220 is not in use based on the voltage on the ZQ pin.

In operation 320, the first arbiter circuit 224a sinks a predetermined amount of current from the resistor connected to the ZQ pin 220. Here, the first arbiter circuit 224a generally sinks an amount of current that is sufficient to definitively take control on the ZQ pin 220 regardless of any concurrent attempts by other devices to obtain control of the ZQ pin 220. In one implementation, the first arbiter circuit 224a sinks, for example, 5 mA of current from the ZQ pin 220. As shown in FIG. 3A, this operation may be generally referred to a "state 3" of the bus master arbitration protocol. Following operation 320, operation 324 may be executed.

In operation 324, the first arbiter circuit 224a has obtained control of the ZQ pin 220. At this point, the first arbiter circuit 224a may enable an associated calibration circuit (shown in FIG. 1) to begin a calibration process.

Figure 3B:
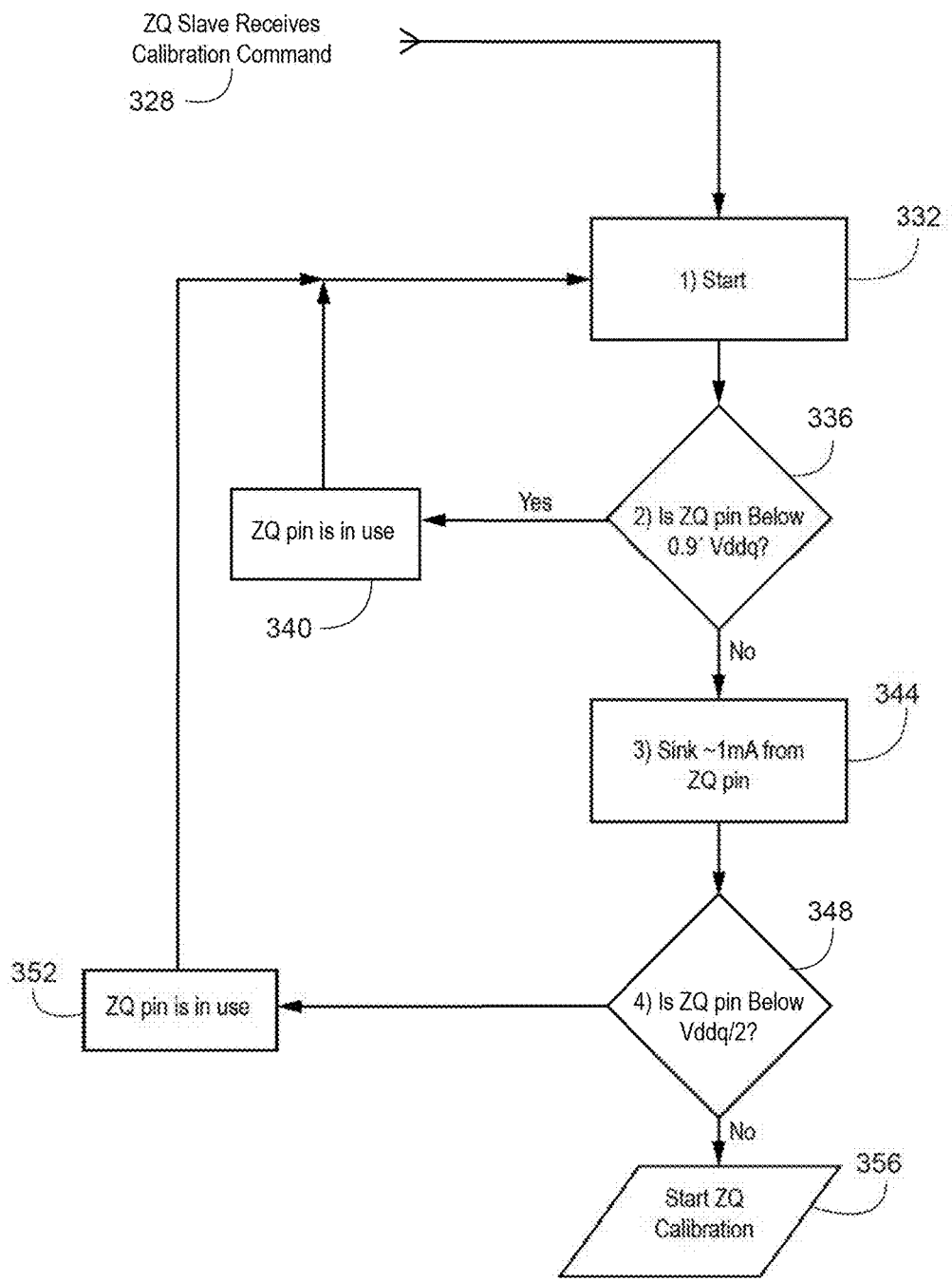

Turning now to operations executed by an arbitration bus slave, reference is made to FIG. 3B. The following discussion of FIG. 3B makes reference to the example configuration of FIG. 2, by way of example. FIG. 3B is a flow chart that illustrates arbitration bus slave operations that may be executed by an arbiter circuit in accordance with the present disclosure that is appropriately designated as arbitration bus slave in a configuration where two memory devices are connected in common to one ZQ pin. As mentioned above, the ODT 228b pin associated with second memory device 208b may be coupled to a relatively high voltage or floated to indicate that the memory device 208b is an arbitration bus slave. Continuing with this example, the arbitration bus slave operations of FIG. 3B are discussed in the context of the second arbiter circuit 224b acting as the arbitration bus slave.

Initially, in operation 328, a calibration command is received by a memory device associated with the second arbiter circuit 224b. In the dual channel configuration of FIG. 2, the second arbiter circuit 224b is associated with both first and second memory channels 204c and 204d. Thus, in this configuration, for example, the calibration command may be initially received by the memory device 208b from either controller associated with Channels A or B. The calibration command generally instructs the memory device to which it is directed to perform a calibration operation using the ZQ resistor connected to the ZQ pin 220. Prior to executing the calibration command, the memory device 208b obtains control of ZQ pin 220 to the exclusion of the other memory device associated with the memory 200. Thus, prior to executing the calibration command, the memory device 208b passes control to the second arbiter circuit 224b.

In operation 332, the second arbiter circuit 224b begins by monitoring the voltage of the ZQ pin 220. If the ZQ pin 220 is in use, the voltage on the ZQ pin 220 will be below a power supply voltage ($V_{dd}$). If the ZQ pin 220 is not in use, the voltage on the ZQ pin 220 will be close to the power supply voltage ($V_{dd}$). Thus, in order to distinguish between these two states, the second arbiter circuit 224b generally monitors the voltage on the ZQ pin 220 based on a threshold voltage that is relative to the power supply voltage. In one implementation, for example, the second arbiter circuit 224b monitors the voltage on the ZQ pin 220 based on a threshold voltage that is 90% of power supply voltage. As shown in FIG. 3B, this initial monitoring of the ZQ pin 220 is generally referred to as "state 1" of the bus slave arbitration protocol. Following operation 332, operation 336 may be executed.

In operation 336, the second arbiter circuit 224b determines if the voltage on the ZQ pin 220 is below the threshold voltage. As shown in FIG. 3B, this determination operation may be generally referred to a "state 2" of the bus slave arbitration protocol. If, in operation 336, the second arbiter circuit 224b determines that the voltage on the ZQ pin 220 is below the threshold voltage, operation 340 may then be executed. In operation 340, the arbiter circuit 224b determines that the ZQ pin 220 is in use. Operation 332 is then executed again following operation 340 such that voltage monitoring on the ZQ pin 220 continues. If, in operation 336, the second arbiter circuit 224b determines that the voltage on the ZQ pin 220 is equal to or above the threshold voltage, operation 344 may then be executed because the ZQ pin 220 is not in use based on the voltage on the ZQ pin.

In operation 344, the second arbiter circuit 224b sinks a predetermined amount of current from the resistor connected to the ZQ pin 220. Here, the second arbiter circuit 224b generally sinks an amount of current that is sufficient to indicate an attempt to take control of the ZQ pin 220 but not enough to definitively take control on the ZQ pin 220. In one implementation, the second arbiter circuit 224b sinks approximately 1mA of current from the ZQ pin 220. Here, the second arbiter circuit 224b acting as a slave sinks 1 mA to pull the pin below 0.9 Vdd (the first threshold voltage). Thus, if the first arbiter circuit 224a acting as an arbitration master is just beginning the arbitration process, the first arbiter circuit 224a will sense that voltage level and back-off. As shown in FIG. 3B, this operation may be generally referred to a "state 3" of the bus slave arbitration protocol. Following operation 344, operation 348 may be executed.

In operation 348, the second arbiter circuit 224b again monitors the voltage present on the ZQ pin 220. Here, the second arbiter circuit 224b monitors the ZQ pin 220 to determine if the first arbiter circuit 224a operating as the arbitration bus master has seized control of the ZQ pin 220. If the first arbiter circuit 224a has seized control of the ZQ pin 220, the voltage on the ZQ pin 220 will be less than half a power supply voltage ($V_{ddq/2}$). If the first arbiter circuit 224a has not seized control of the ZQ pin 220, the voltage on the ZQ pin 220 will be greater than half of the power supply voltage ($V_{ddq/2}$). Thus, in order to distinguish between these two states, the second arbiter circuit 224b generally monitors the voltage on the ZQ pin 220 based on a threshold voltage that is half of the power supply voltage. More specifically, second arbiter circuit 224b, acting as a slave, monitors the pin a second time to cover the scenario where both the first arbiter circuit 224a, acting as an arbitration bus master, and the second arbiter circuit 224b start at the same time. In this case, both proceed past the initial monitoring step and sink current from the pin. The arbitration bus master sinks 5 mA and the slave sinks 1 mA. Here, the ZQ pin voltage sinks below 0.5 Vdd (the second threshold voltage). The slave senses this voltage level and backs-off. The arbitration bus master goes directly to the calibration operation without further monitoring of the pin. As shown in FIG. 3B, this second voltage monitoring of the ZQ pin 220 is generally referred to as "state 4" of the bus slave arbitration protocol. If, in operation 348, the second arbiter circuit 224b determines that the voltage on the ZQ pin 220 is below the threshold voltage, operation 352 may then be executed.

In operation 352, the arbiter circuit 224b determines that the first arbiter circuit 224a has seized control of the ZQ pin 220. Operation 332 is then executed again following operation 352 such that voltage monitoring on the ZQ pin 220 continues. If, in operation 348, the second arbiter circuit 224b determines that the voltage on the ZQ pin 220 is equal to or above the threshold voltage, operation 356 may then be executed.

In operation 356, the second arbiter circuit 224b has obtained control of the ZQ pin 220. At this point, the second arbiter circuit 224b may enable an associated calibration circuit (shown in FIG. 1) to begin a calibration process.

In summary, FIG. 3A and FIG. 3B illustrate example operations in accordance with a two-device arbitration protocol for, respectively, an arbiter circuit acting as an arbitration bus master and an arbiter circuit acting as an arbitration bus slave. As shown in FIG. 3A, a first arbiter circuit 224a acting as an arbitration bus master may take control of the ZQ pin 220 by determining that a voltage at the ZQ pin 220 is equal to or above a first threshold voltage and, in response, sinking a predetermined amount of current from the resistor connected to the ZQ pin 220 so as to take control of the resistor for use by an associated calibration circuit. As shown in FIG. 3B, a second arbiter circuit 224b acting as an arbitration bus slave may take control of the ZQ pin 220 by determining that a voltage at the ZQ pin 220 is equal to or above a first threshold voltage, sinking a predetermined amount of current from the ZQ pin 220, determining that the voltage at the ZQ pin 220 is equal to or above a second threshold voltage and, in response, taking control of the ZQ pin 220 for use by an associated calibration circuit to perform a calibration operation.

Figure 4:
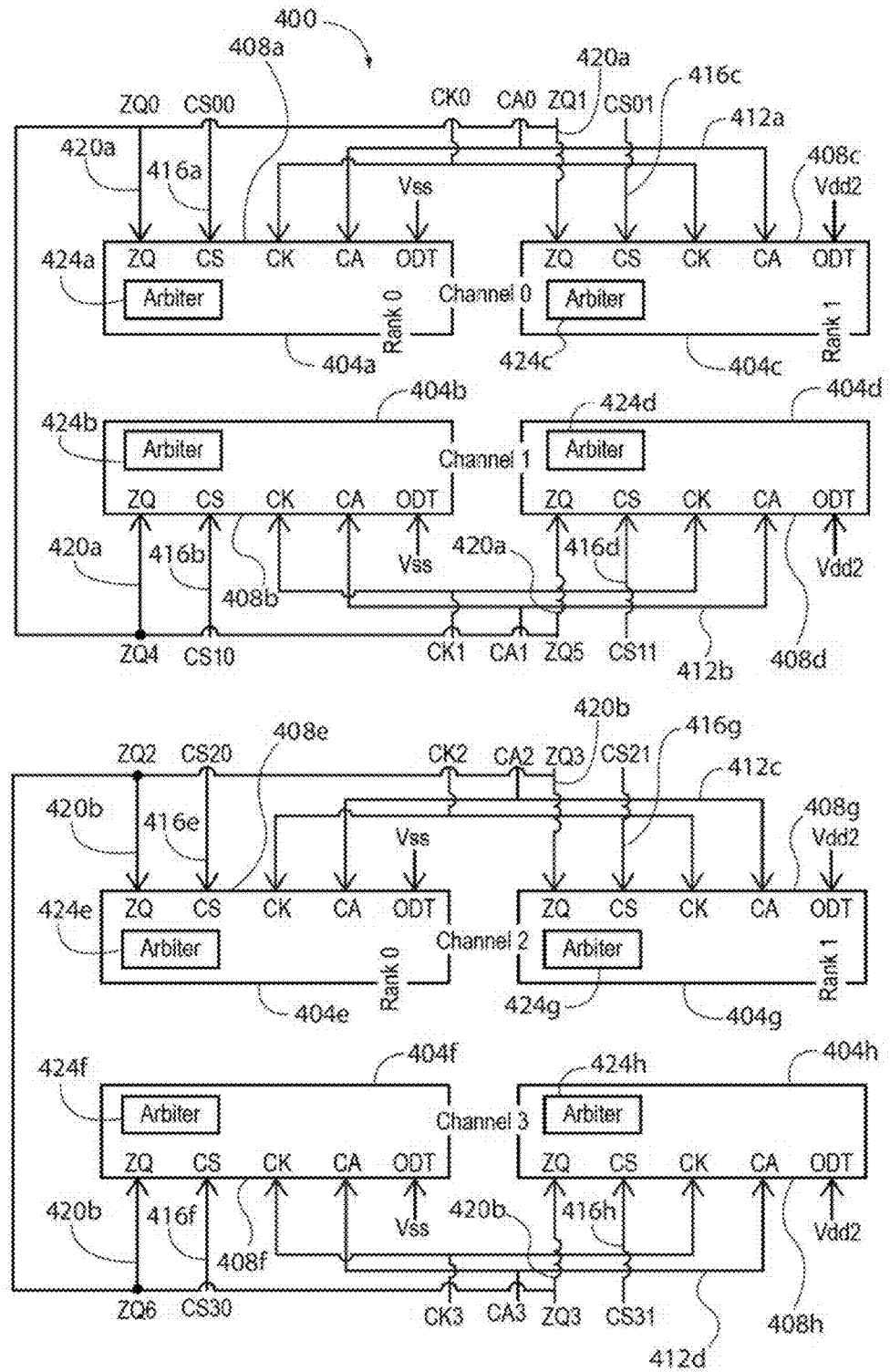
FIG. 4 is another example memory that includes a plurality of memory devices in accordance with the present disclosure.

FIG. 4 is an example memory 400 that includes a plurality of memory devices 404a-h in accordance with the present disclosure. The memory devices 404a-h are arranged across eight semiconductor dies 408a-h in a four channel, two rank configuration. The memory 400 shown in FIG. 4 includes a first channel labelled as "Channel 0," a second channel labelled as "Channel 1," a third channel labelled as "Channel 2," and a fourth channel labelled as "Channel 3." Each of Channels 0-3 include a first rank labelled "Rank 0" and a second rank labelled "Rank 1." Channel 0 is generally associated with a first controller that is configured to communicate across a common command and address bus 412a with either Rank 0 or Rank 1. Similarly, Channel 1 is connected to a second controller that is configured to communicate across a common command and address bus 412b with either Rank 0 or Rank 1; Channel 2 is connected to a third controller that is configured to communicate across a common command and address bus 412c with either Rank 0 or Rank 1; and Channel 3 is connected to a fourth controller that is configured to communicate across a common command and address bus 412d with either Rank 0 or Rank 1. The controllers coupled to the memory 400 select the rank to which data is to be transmitted or received through chip select lines 416a-h that connect to the respective dies 408a-h.

The example memory 400 of FIG. 4 includes eight separate semiconductor dies 408a-h. Each semiconductor die 408a-h is arranged in a signal channel configuration such that each includes one of the memory devices 404a-h. The first semiconductor die 408a includes the first memory device 404a; the second semiconductor die 408b includes the second memory device 404b; the third semiconductor die 408c includes the third memory device 404c; and so on. As can be seen in FIG. 4, the first die 408a implements Rank 0 for Channel 0. Rank 0 for Channel 1 is implemented on a separate die, namely the second die 408b. Rank 1 is configured similarly to the Rank 0 configuration and Channels 2 and 3 are configured similarly to Channels 0 and 1. As also be seen in FIG. 4, a first ZQ pin 420a is shared between the first, second, third, and fourth memory devices 404a-d. Similarly, a second ZQ pin 420b is shared between the fifth, six, seventh and eighth memory devices 404e-h. This arrangement can lead to potential contention on either of the first and second ZQ pins 420a-b. For example, contention can arise on the first ZQ pin 420a when calibration commands are concurrently issued to two or more of the first, second, third and fourth memory devices 404a-d. In one example, contention for the ZQ pin 420a may occur in the event that Channel 0 issues a calibration command on Rank 0 and Channel 1 issues a calibration command on Rank 0. Here, it may be the case the no communication path exists between the first and second controllers and no communication path exists between the two semiconductor dies 408a-b. Thus, when Channel 0, Rank 0 attempts to take control of the first ZQ pin 420a, it may have no knowledge of what Channel 1, Rank 0 may or may not be doing with the first ZQ pin 420a. In order to resolve these potential contentions, the eight semiconductor dies 408a-h may each include an arbiter circuit 424a-h in accordance with the present disclosure.

Arbiter circuits 424a-h may be generally configured to resolve contention on the ZQ pins 420a-b that may occur when simultaneous or substantially simultaneous calibration commands are issued by two or more of the eight memory devices 404a-h. The first through eighth semiconductor dies 408a-h are each assigned a protocol priority that may be specified through input provided on designated inputs. In this implementation, there are four arbiter circuits that arbitrate for control of the same ZQ pin. For example, the first through fourth arbiter circuits 424a-d arbitrate for control of the first ZQ pin 420a. Similarly, the fifth through eighth arbiter circuits 424e-h arbitrate for control the second ZQ pin 420b. Thus, for each of these two groups of arbiter circuits, four protocol priorities are needed to differentiate between the various arbiter circuits. Here, one memory device may be assigned as the arbitration bus master and the other memory device assigned as the arbitration bus slaves 0-2.

In operation, the first, second, third, and fourth arbiter circuits 424a-d use the first ZQ pin 420a in an arbitration protocol that selectively grants access to the first ZQ pin 420a. Similarly, the fifth, sixth, seventh, and eighth arbiter circuits 424e-h use the second ZQ pin 420b in an arbitration protocol that selectively grants access to the second ZQ pin 420a-b. As described in connection with FIG. 1, ZQ pins 420a-b are each connected to an external resistor that is used in a calibration operation executed by a calibration circuit in response to a calibration command. Thus, the same ZQ pin 420a-b is used in both an arbitration operation and a calibration operation, each of which is executed in response to receiving a calibration command. In configurations such as illustrated in FIG. 4 where four arbiter circuits arbitrate for use of a ZQ pin to which they are commonly connected, one arbiter may be designated as the arbitration bus master and the remaining three arbiter circuits may be designated as the arbitration bus slaves 0-2. For example, the first arbiter circuit 424a may be designated as the arbitration bus master, and the second, third, and fourth arbiter circuits 424b-d may be designated as the arbitration bus slaves 0-2. In this example, the arbitration protocol selectively grants access to the first ZQ pin 420a by giving the arbitration bus master access to the first ZQ pin 420a in the event that the arbitration bus master attempts to take control of the resistor for use in a first calibration operation concurrently with any of the arbitration bus slaves attempting to take control of the first ZQ pin 420*a* for use in a second calibration operation. If two or more of the arbitration bus slave devices attempt to take control of the first ZQ pin 420*a* without the arbitration bus master also doing so, the arbitration protocol will give the arbitration bus slave device with the highest priority designation access to the first ZQ pin 420*a*. Example operations in accordance with this four-device arbitration protocol that may be executed by arbiter circuits acting as either arbitration bus master or arbitration bus slave are discussed in greater detail below in connection with FIG. 8.

Figure 5A:
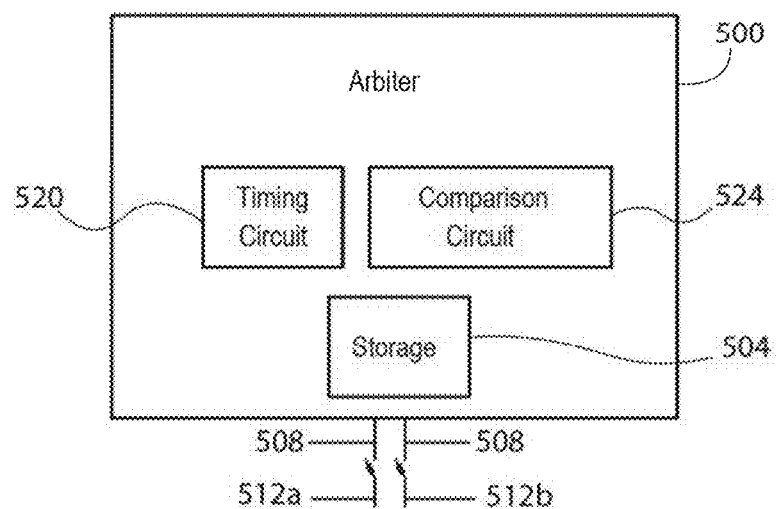
FIG. 5A is block diagram of an arbiter circuit embodiment that includes fuses that are used to set an arbitration protocol priority.
Figure 5B:
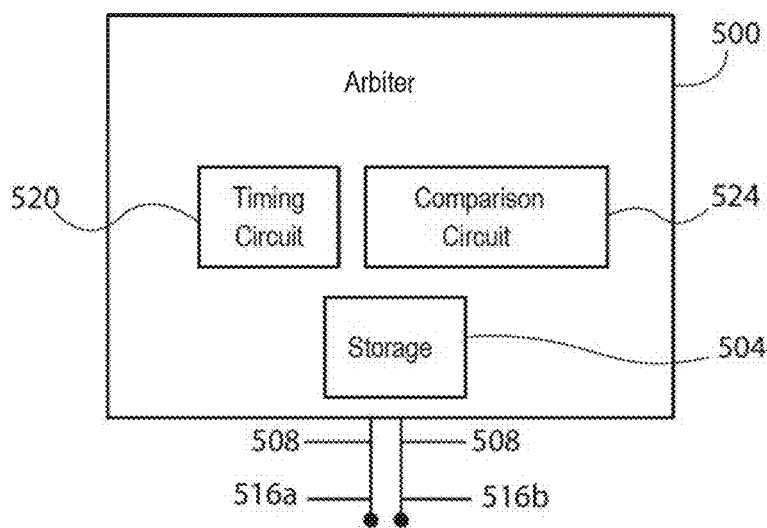
FIG. 5B is block diagram of an arbiter circuit embodiment that includes input pins that are used to set an arbitration protocol priority.

FIG. 5A and FIG. 5B are block diagrams of an example arbiter circuit 500 that may be used to arbitrate for control of the ZQ pin the memory configuration of FIG. 4 or in other memory configurations discussed herein. In one respect, FIG. 5A and FIG. 5B illustrate different mechanisms for designating that a particular arbiter is assigned a particular priority within an arbitration protocol, such as the four-device arbitration protocol illustrated in FIG. 8. In this regard, the example arbiter circuit 500 may include a data storage element 504 that stores data that specifies an arbitration protocol priority designation for the arbiter circuit 500. The arbiter circuit 500 may include one or more data inputs lines 508 that allow the arbitration protocol priority designation data to be loaded from an external location. By way of example, the arbiter circuit 500 shown in FIG. 5A and FIG. 5B includes two input lines 508, each of which may be asserted or de-asserted in four different permutations. The four possible permutations of inputs on the data inputs lines 508 correspond to four possible arbitration protocol priority designations. It should be appreciated that alternative arbiter embodiments, may include different numbers of data inputs lines and thus different numbers of possible arbitration protocol priority designations. For example, an arbiter embodiment may include three data input lines resulting in eight possible arbitration protocol priority designations, four data input lines resulting in sixteen possible arbitration protocol priority designations, and so on.

FIG. 5A and FIG. 5B show different possible arrangements of the input lines 508 that are used to input arbitration protocol priority designation data into the data storage 504. FIG. 5A is a block diagram that shows a configuration for the arbiter circuit 500 that includes first and second fuse elements 512*a-b* connected to the input lines 508. The fuse elements 512*a-b* may be selectively blown or not blown at an appropriate time in the manufacture or distribution of a memory device that includes the arbiter circuit 500. For example, once the memory element is manufactured or incorporated into a larger memory system, one or more of the fuses 512*a-b* may be blown to designate the arbitration priority for the given memory element that includes the arbiter circuit 500. In operation, the arbiter circuit 500 may discover its priority within an arbitration scheme by reading the data storage element 504 which is driven by the inputs provided by the fuse elements 512*a-b*.

FIG. 5B is a block diagram that shows an alternative configuration for the arbiter circuit 500 that includes a bond-out option. In the configuration of FIG. 5B, the arbiter circuit 500 includes a data storage element 504 that is provided with data from input lines 508 that connect to external pads 516*a-b*. Here, the data input lines 508 extend from the memory device associated with the arbiter circuit 500 to the external packaging that contains the various memory devices associated with the given memory. In the configuration of FIG. 5B, the arbitration priority assigned to the arbiter circuit 500 may be dynamically changed during the lifetime of the memory device. Specifically, different data inputs may be provided to the data storage 504 through the external pads 516*a-b* to specify different arbitration protocol priorities for the arbiter circuit 500. At various times, these different inputs may be stored in the storage element 504 and discovered by the arbiter circuit 500 for use at the appropriate time.

The example arbiter circuit 500 may be used in a memory configuration such as illustrated in FIG. 4. More specifically, the example arbiter circuit 500 may be used in a configuration where four arbiter circuits arbitrate for control of a ZQ pin to which they are commonly connected. The arbiter circuit 500 may be given an arbitration priority designation that ranges from first to fourth. This priority designation given to the arbiter circuit 500 may be unique among the other arbiter circuits that are connected to the same ZQ pin. If the arbiter circuit 500 is given the first priority designation, the arbiter circuit 500 may be referred to as the arbitration bus master. If the arbiter circuit 500 is given the second, third, or fourth priority designation, the arbiter circuit 500 may be referred to, respectively, as the arbitration bus slave 0, arbitration bus slave 1, or arbitration bus slave 2.

FIG. 6 is a table 600 that represents an example of the type data that may be stored in the data storage 504 and used to provide an arbitration protocol priority designation for an arbiter circuit 500. The table 600 includes first and second rows 604*a-b* that correspond to the inputs received at the data storage element 504 from the data input lines 508. The contents 612 of the table 600 include the various permutations that can be achieved through digital input provided on the data input lines 508. An arbiter circuit 500 may be configured to recognize each of the possible permutations as corresponding to a particular arbitration protocol priority designation. Example arbitration protocol priority designations are provided in columns 608*a-d*. Thus, as shown table 600, an arbiter circuit 500 may be configured to recognize the digital code "10" as corresponding to a "Master" designation, the digital code "11" as corresponding to a "Slave 0" designation, the digital code "00" as corresponding to a "Slave 1" designation, and the digital code "01" as corresponding to a "Slave 2" designation. It should be appreciated that the correspondences of table 600 are provided by way example and not limitation. Alternative assignments of digital code to arbitration protocol priority designations may be used in accordance with various embodiments.

An arbitration protocol in accordance with the present disclosure may make use of delay times in resolving potential contentions on a ZQ pin. As shown in FIG. 5A and FIG. 5B, an aribiter 500 may include a timer circuit 520 that may be used to tracks these delay times. An arbitration protocol that functions in this manner may assign different delay times for each arbiter circuit that is connected in common to a particular ZQ pin. FIG. 7 is a table 700 that represents an example delay time assignment for a group of four memory devices connected in common to the same ZQ pin. The table 700 includes a first row 704*a* that specifies a first set of delay time periods and a second row 704*b* that specifies a second set of delay time periods. Each column 708*a-d* of the table 700 corresponds to a particular memory device in a group of memory devices attached in common to the same ZQ pin. As shown by the various entries 712 in the table 700, the delay times are arranged in increasing larger increments starting with the arbitration bus master which has the smallest delay time. Thus, if a first memory device has a higher arbitration priority than a second memory device, then for a given set of delay times (e.g. either the first row 704*a* or the second row 704*b*), the first time period for the first memory device is shorter than a corresponding time period assigned to the second memory device.

In an arbitration protocol that uses delay times, an arbiter may be configured to back-off from attempts to acquire the ZQ pin for its specified time period when the arbiter senses that the ZQ pin is in use or is in the process of being acquired by another arbiter. In accordance with various embodiments, sensing this contention may include comparing a voltage measuring at the ZQ pin to reference voltage that corresponds to a voltage that is expected to on the ZQ pin when the pin is not in use. In order to make this comparison, an arbiter circuit 500 may include a comparison circuit 524 provided in association with a timer circuit 520 as shown in FIG. 5A and FIG. 5B. When two arbiter circuits concurrently attempt to acquire the ZQ pin, both will sense this contention and back-off for their assigned times before retrying. Because each arbiter that is connected in common to a particular ZQ pin is assigned a different delay time, the two arbiter circuits that first concurrently attempted to acquire the ZQ pin will retry their attempts to acquire the ZQ pin at different times.

In this way, contention on the ZQ pin may be avoided. An arbitration protocol that makes use of delay times in this manner is explained in greater detail below in connection with FIG. 8.

Figure 8:
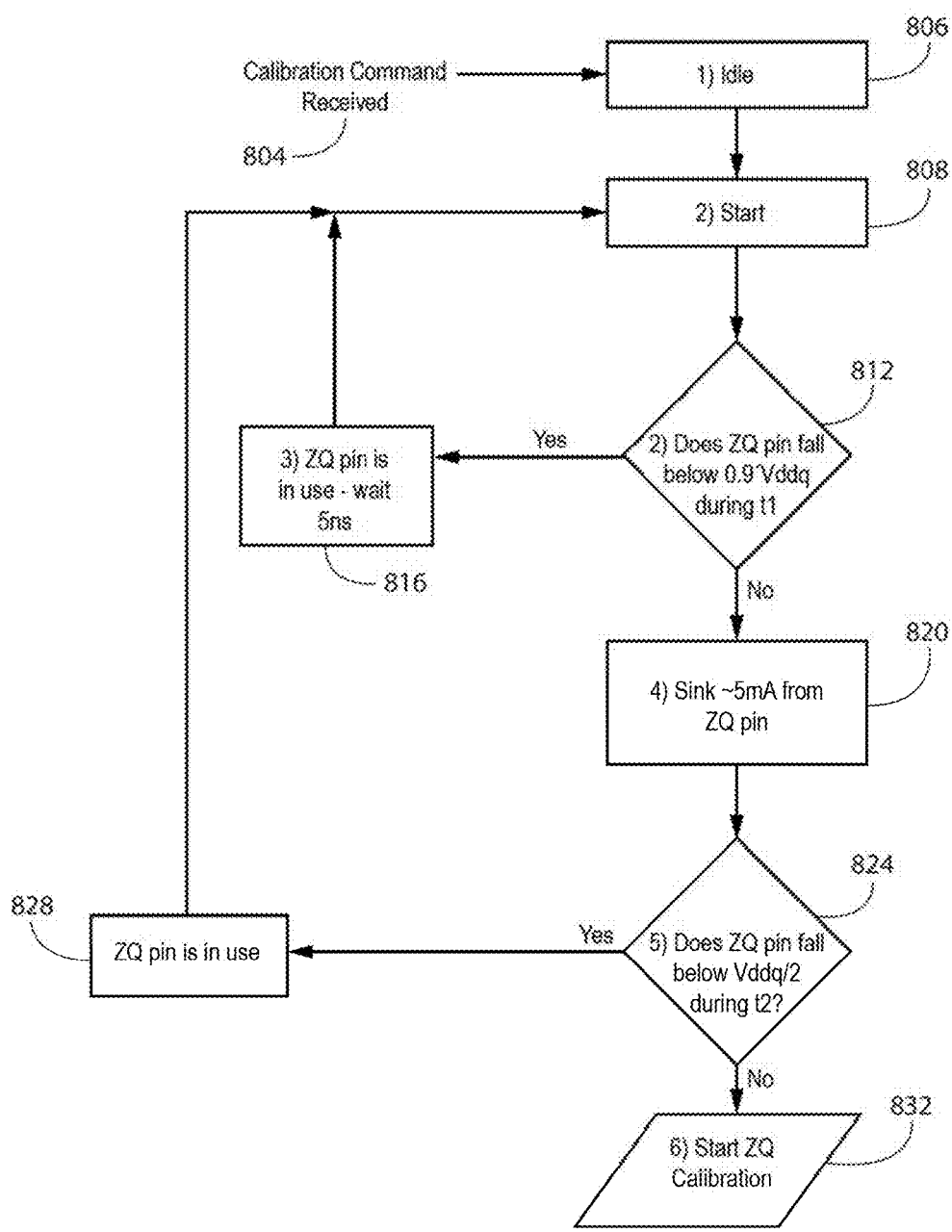
FIG. 8 is a flow chart that illustrates another arbitration method in accordance with the present disclosure.

Turing now to operations executed in a four-device arbitration protocol, reference is made to FIG. 8. The following discussion of FIG. 8 makes reference to the configuration of FIG. 4, by way of example. FIG. 8 is a flow chart that illustrates either an arbitration bus master or an arbitration bus slave operations that may be executed by an arbiter circuit in accordance with the present disclosure that is appropriately designated as either an arbitration bus master, an arbitration bus slave 0, an arbitration bus slave 1, or an arbitration bus slave 2 in a configuration where four memory devices are connected in common to one ZQ pin. As mentioned above, a memory device may be assigned an arbitration protocol priority through data input lines that provide priority designation data to a data storage component associated with an arbiter circuit assigned to the memory device. The data priority designation data may be provided to the data input lines through fuses, external input pads, and so on.

Initially, in operation 804, a calibration command is received by one of the memory devices 404*a-h* associated with the memory 400. While the memory 400 includes eight memory devices 404*a-h*, the following discussion references, by way of example, calibration commands that are received by one or more of the four memory devices 404*a-d* that are connected to the first ZQ pin 420*a*. The calibration command generally instructs the memory device to which it is directed to perform a calibration operation using the ZQ resistor connected to the first ZQ pin 420*a*. Prior to executing the calibration command, the memory device obtains control of the first ZQ pin 420*a* to the exclusion of the other memory devices that could possibly take control of the first ZQ pin 420*a*. Thus, prior to executing the calibration command, the memory device passes control to the arbiter circuit with which it is associated.

In operation 806, control passes to the arbiter circuit so that the arbiter circuit may begin the process of attempting to obtain control of the first ZQ pin for use in a calibration process that is to be executed responsive to the calibration command received in operation 804. Prior to control passing to the arbiter circuit, the arbiter circuit may be operating in an idle state. As shown in FIG. 8, this idle state of the arbiter circuit is generally referred to as "state 1" of the bus arbitration protocol. Following operation 806, operation 808 may be executed.

In operation 808, the arbiter circuit begins by monitoring the voltage present on the first ZQ pin 420*a*. If the first ZQ pin 420*a* is in use, the voltage on the first ZQ pin 420*a* will be below a power supply voltage ($V_{dd}$). If the first ZQ pin 420*a* is not in use, the voltage on the first ZQ pin 420*a* will be close to the power supply voltage ($V_{dd}$). Thus, in order to distinguish between these two states, the arbiter circuit generally monitors the voltage on the first ZQ pin 420*a* based on a threshold voltage that is close to the power supply voltage. In one implementation, the arbiter circuit monitors the voltage on the first ZQ pin 420*a* based on a threshold voltage that is 90% of power supply voltage. As shown in FIG. 8, this initial monitoring of the first ZQ pin 420*a* is generally referred to as "state 2" of the bus arbitration protocol. Following operation 808, operation 812 may be executed.

In operation 812, the arbiter circuit determines if the voltage on the first ZQ pin 420*a* falls below the threshold voltage within a predetermined time interval. As one measure in preventing contention on the first ZQ pin 420*a*, the arbiter circuit monitors the voltage on the first ZQ pin during a time interval whose duration depends on the arbiter circuit's arbitration protocol priority. As mentioned above, FIG. 7 provides example delay times that may be used in memory configurations where four arbiter circuits are connected in common to a single ZQ pin. In this regard, row 704*a* provides example delay times that may be used by the four memory devices in connection with operation 812. Thus, continuing with this example, if the arbiter circuit is designated as Master, the arbiter circuit may monitor the ZQ pin 420*a* for 25 nanoseconds. If the arbiter circuit is designated as Slave 0, the arbiter circuit may monitor the ZQ pin 420*a* for 30 nanoseconds. If the arbiter circuit is designated as Slave 1, the arbiter circuit may monitor the ZQ pin 420*a* for 35 nanoseconds. If the arbiter circuit is designated as Slave 2, the arbiter circuit may monitor the ZQ pin 420*a* for 40 nanoseconds. As shown in FIG. 8, this determination operation may be generally referred to a "state 3" of the bus arbitration protocol.

If, in operation 812, the arbiter circuit determines that the voltage on the first ZQ pin 420*a* falls below the threshold voltage for the appropriate predetermined time interval, operation 816 may then be executed. In operation 816, the arbiter circuit determines that the first ZQ pin 420*a* is in use. Operation 808 is then executed again following operation 816 such that voltage monitoring on the first ZQ pin 420*a* continues. If, in operation 812, the arbiter circuit determines that the voltage on the first ZQ pin 420*a* did not fall below the threshold voltage for the appropriate predetermined time interval, operation 820 may then be executed.

In operation 820, the arbiter circuit determines that the voltage on the first ZQ pin 420*a* is not in use and so an attempt may be made to obtain control of the pin. In accordance with this determination, the arbiter circuit sinks a predetermined amount of current from the resistor connected to the first ZQ pin 420*a*. Here, the arbiter circuit generally sinks an amount current that is sufficient to take control on the first ZQ pin 420*a* provided that no other arbiter circuit having a higher priority also attempts to take control of the pin. In one implementation, the arbiter circuit sinks approximately 5 mA of current from the first ZQ pin 420*a*. As shown in FIG. 8, this determination operation may be generally referred to as "state 4" of the bus arbitration protocol. Following operation 820, operation 824 may be executed.

In operation 824, the arbiter circuit again monitors the voltage present on the first ZQ pin 420a. As mentioned, the arbiter circuit will take control of the first ZQ pin 420a by sinking a predetermined amount of current from the pin provided that no other arbiter circuit having a higher priority also attempts to take control of the pin. The arbiter circuit discovers the presence of the other arbiter circuit attempting to take control of the pin through the voltage monitoring conducted in operation 824. Here, the arbiter circuit delays taking control of the first ZQ pin 420a for a predetermined time interval during which the arbiter circuit monitors the first ZQ pin 420a for voltage changes. This additional predetermined time interval provides an additional measure in preventing contention on the first ZQ pin 420a. As was the case in operation 812, the arbiter circuit monitors the voltage on the first ZQ pin during a time interval whose duration depends on the arbiter circuit's arbitration protocol priority. FIG. 7 provides example delay times that may be used in memory configurations where four arbiter circuits are connected in common to a single ZQ pin. In this regard, row 704b provides example delay times that may be used by the four memory devices in connection with operation 824. Thus, continuing with this example, if the arbiter circuit is designated as Master, the arbiter circuit may monitor the ZQ pin 420a for 5 nanoseconds. If the arbiter circuit is designated as Slave 0, the arbiter circuit may monitor the ZQ pin 420a for 10 nanoseconds. If the arbiter circuit is designated as Slave 1, the arbiter circuit may monitor the ZQ pin 420a for 15 nanoseconds. If the arbiter circuit is designated as Slave 2, the arbiter circuit may monitor the ZQ pin 420a for 20 nanoseconds.

In operation 824, the arbiter circuit monitors the first ZQ pin 420a to determine if another arbiter circuit is also attempting to obtain control of the pin. If another arbiter circuit is not attempting to take control of the first ZQ pin 420a, the voltage on the pin will not fall to less than half a power supply voltage ($V_{ddq/2}$). If another arbiter circuit is attempting to take control of the first ZQ pin 420a, the voltage on the pin will fall to less than half of the power supply voltage ($V_{ddq/2}$). Thus, in order to distinguish between these two states, the second arbiter circuit 424b generally monitors the voltage on the ZQ pin 420a based on a threshold voltage that is close to half of the power supply voltage. As shown in FIG. 8, this second voltage monitoring of the ZQ pin 420a is generally referred to as "state 5" of the bus arbitration protocol.

If, in operation 824, the arbiter circuit determines that the voltage on the first ZQ pin 420a has fallen below the threshold voltage within the appropriate predetermined time interval, operation 828 may then be executed. In operation 828, the arbiter circuit determines that another arbiter circuit is attempting to obtain control of the first ZQ pin 420a. Operation 808 is then executed again following operation 828 such that voltage monitoring on the first ZQ pin 420a continues. If, in operation 824, the arbiter circuit determines that the voltage on the first ZQ pin 420a does not fall below the threshold voltage for the predetermined time interval, operation 832 may then be executed.

In operation 832, the arbiter circuit has obtained control of the first ZQ pin 420a. At this point, the arbiter circuit may enable an associated calibration circuit (shown in FIG. 1) to begin a calibration process.

Figure 9A:
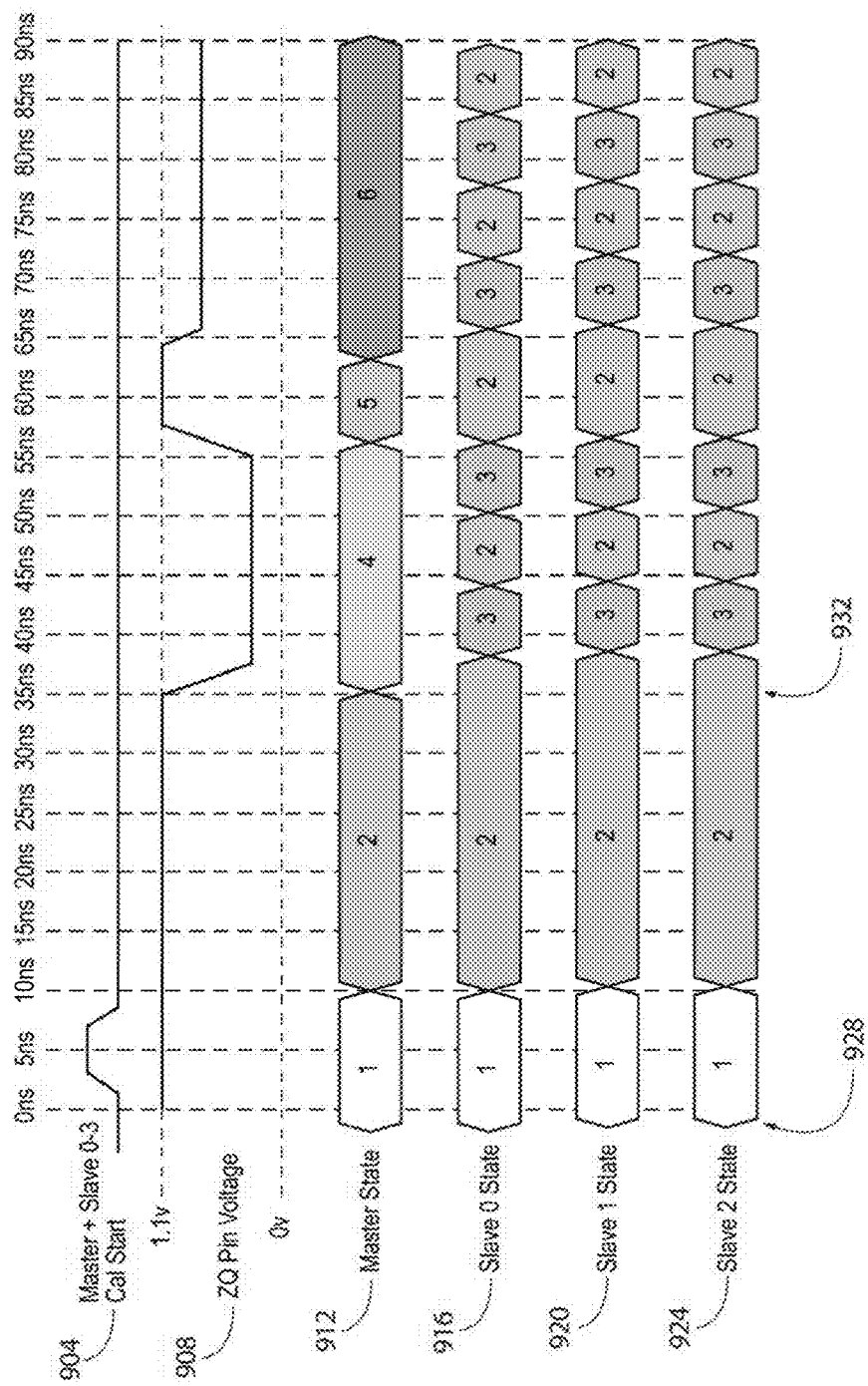
FIG. 9A is a timing diagram that illustrates an example arbitration according to the arbitration method of FIG. 8.
Figure 9B:
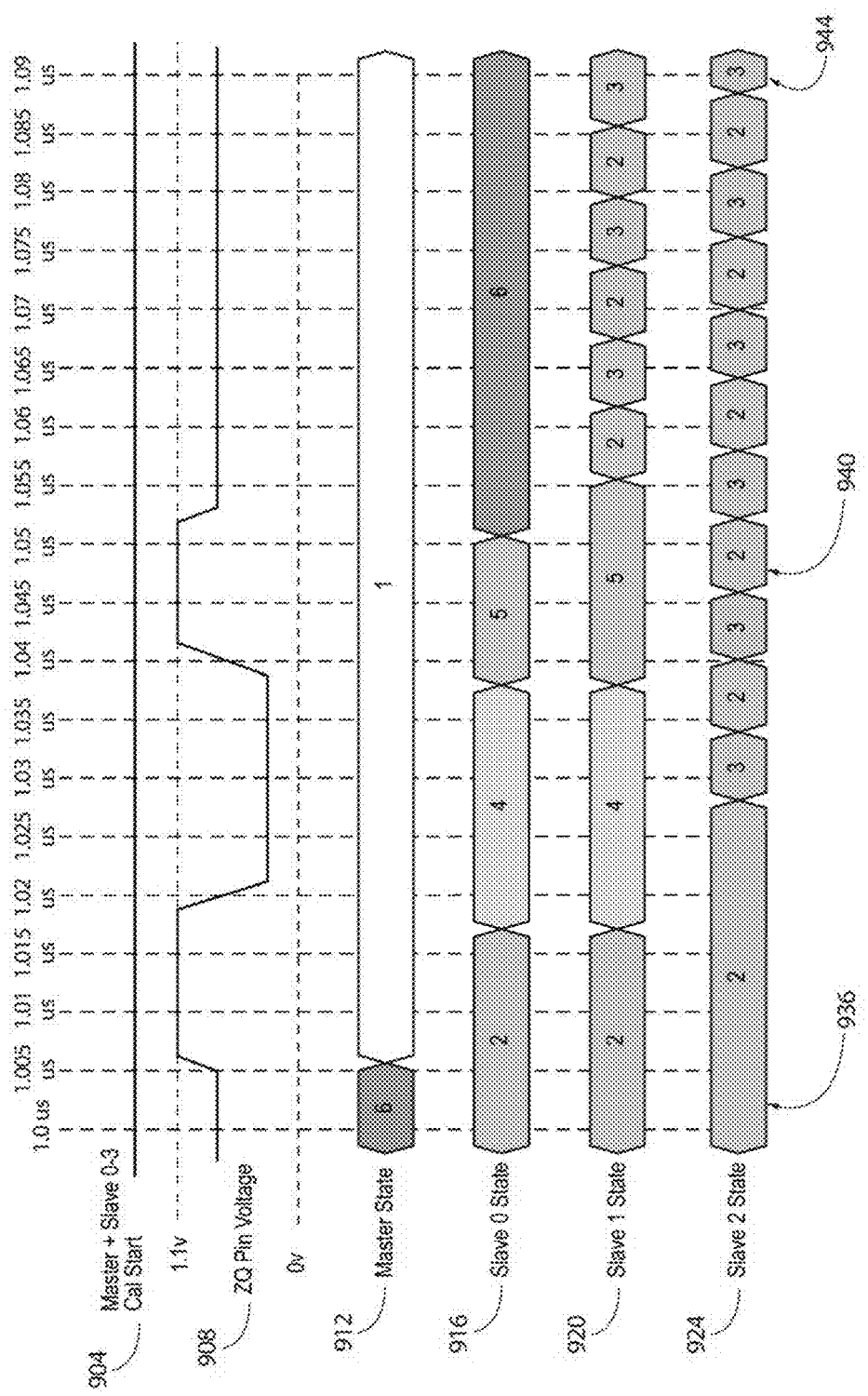
FIG. 9B is a timing diagram that illustrates another example arbitration according to the arbitration method of FIG. 8.

FIGS. 9A-B illustrate a sequence of example arbitrations in accordance with the arbitration method illustrated in FIG. 8. FIGS. 9A-B include a number of signal traces corresponding to various components involved in a four-device arbitration. Trace 904 corresponds to a signal trace that indicates the beginning of a calibration command. By way of example and not limitation, trace 904 shows a calibration command being issued to all memory devices that are connected in common to a given ZQ pin. In other cases that may be handled by present embodiments, calibration commands may be issued to the various memory devices at different times. Trace 908 corresponds to the voltage on the ZQ pin. Trace 912 indicates the arbitration state of an arbitration bus master memory device. Trace 916 indicates the arbitration state of an arbitration bus slave 0 memory device. Trace 920 indicates the arbitration state of an arbitration bus slave 1 memory device. Trace 924 indicates the arbitration state of an arbitration bus slave 2 memory device. The arbitration states indicated in traces 912, 916, 920, and 924 correspond to the arbitration states indicated in FIG. 8. As can be seen in FIG. 9A, the arbitration bus master obtains control of the ZQ pin at time 932. Following time 932, the calibration operation associated with the arbitration bus master proceeds to completion (time 936) while the arbitration bus slaves 0-2 loop through arbitration states 2 and 3. In FIG. 9B, the arbitration slave 0 obtains control of the ZQ pin at time 940. Following time 940, the calibration operation associated with the arbitration bus slave 0 proceeds to completion (time 944) while the arbitration bus slaves 0-2 loop through arbitration states 2 and 3, with the arbitration bus slave 2 having entered arbitration state 5 at one point.

The above specification, examples and data provide a complete description of the structure and use of exemplary embodiments of the invention as defined in the claims. Although various embodiments of the claimed invention have been described above with a certain degree of particularity, or with reference to one or more individual embodiments, those skilled in the art could make numerous alterations to the disclosed embodiments without departing from the spirit or scope of the claimed invention. Other embodiments are therefore contemplated. It is intended that all matter contained in the above description and shown in the accompanying drawings shall be interpreted as illustrative only of particular embodiments and not limiting. Changes in detail or structure may be made without departing from the basic elements of the invention as defined in the following claims.

The foregoing description has broad application. The discussion of any embodiment is meant only to be explanatory and is not intended to suggest that the scope of the disclosure, including the claims, is limited to these examples. In other words, while illustrative embodiments of the disclosure have been described in detail herein, the inventive concepts may be otherwise variously embodied and employed, and the appended claims are intended to be construed to include such variations, except as limited by the prior art.

The invention claimed is:

1. An apparatus comprising:
   a resistor coupled between a supply voltage and a terminal; and
   a device including an impedance control circuit coupled to the terminal, and the impedance control circuit configured, responsive to a calibration command, to:
   monitor a voltage of the terminal to detect whether the voltage of the terminal is within a first voltage range; and start a calibration operation using the resistor when the voltage of the terminal has been detected to be within the first voltage range.

2. The apparatus of claim 1, wherein the impedance control circuit is configured, responsive to the calibration command, to monitor the voltage of the terminal again when the voltage of the terminal has been detected to be within a second voltage range not overlapping the first voltage range.

3. The apparatus of claim 2, wherein the first voltage range is narrower than the second voltage range.

4. The apparatus of claim 1, further comprising:
an additional device including an additional impedance control circuit coupled to the terminal, and the additional impedance control circuit configured, responsive to the calibration command, to:
monitor the voltage of the terminal to detect whether the voltage of the terminal has been detected to be within the first voltage range; and
start an additional calibration operation in the additional device using the resistor when the voltage of the terminal has been detected to be within the first voltage range by the additional impedance control circuit.

5. The apparatus of claim 4, wherein the additional impedance control circuit is configured, responsive to the calibration command, to monitor the voltage of the terminal again when the voltage of the terminal has been detected to be within the second voltage range not overlapping the first voltage range.

6. The apparatus of claim 4, wherein monitoring the voltage of the terminal by the impedance control circuit and monitoring the voltage of the terminal by the additional impedance control circuit are started contemporaneously.

7. The apparatus of claim 6, wherein monitoring of the voltage of the terminal by the impedance control circuit is terminated before termination of monitoring of the voltage of the terminal by the additional impedance control circuit.

8. The apparatus of claim 1, wherein the impedance control circuit is configured, responsive to the calibration command, to sink a current from the terminal before starting the calibration operation using the resistor.

9. The apparatus of claim 4, wherein the impedance control circuit is configured, responsive to the calibration command, to sink a current from the terminal before starting performance of the calibration operation using the resistor; and
wherein the additional impedance control circuit is configured, responsive to the calibration command, to sink a current from the terminal before starting the additional calibration operation using the resistor.

10. An apparatus comprising:
a controller;
a resistor coupled between a supply voltage and a terminal; and
first and second devices, respectively, including first and second impedance control circuits coupled in common to the terminal and the first and second devices configured to receive a calibration command in common from the controller;
wherein the first impedance control circuit is configured, responsive to the calibration command, to monitor a voltage of the terminal to detect whether the voltage of the terminal is within a first voltage range;
wherein the second impedance control circuit is configured, responsive to the calibration command, to monitor the voltage of the terminal to detect whether the voltage of the terminal is within the first voltage range; and
wherein monitoring the voltage of the terminal by the first impedance control circuit is terminated before termination of monitoring of the voltage of the terminal by the second impedance control circuit being terminated.

11. The apparatus of claim 10, wherein monitoring the voltage of the terminal by the first control circuit and monitoring the voltage of the terminal by the additional impedance control circuit are started contemporaneously.

12. The apparatus of claim 10, wherein the first impedance control circuit is configured, responsive to the calibration command, to start a first calibration operation using the resistor when the voltage of the terminal has been detected to be within the first voltage range by the first impedance control circuit.

13. The apparatus of claim 12, wherein the second impedance control circuit is configured, responsive to the calibration command, to detect the voltage of the terminal to be out of the first voltage range due to the first impedance control circuit being in the first calibration operation.

14. The apparatus of claim 13, wherein the second impedance control circuit is configured, responsive to the calibration command, to monitor the voltage of the terminal again when the first impedance control circuit is in the first calibration operation.

15. The apparatus of claim 14, wherein the second impedance control circuit is configured, responsive to the calibration command, to detect the voltage of the terminal to be within the first voltage range after the first calibration operation has finished.

16. The apparatus of claim 10, wherein the second impedance control circuit is configured, responsive to the calibration command, to start a second calibration operation when the voltage of the terminal has been detected to be within the first voltage range by the second impedance control circuit.

17. The apparatus of claim 12, wherein the first impedance control circuit is configured, responsive to the calibration command, to sink a current from the terminal before starting the first calibration operation using the resistor.

18. The apparatus of claim 16, wherein the first impedance control circuit configured, responsive to the calibration command, to sink a current from the terminal before starting the first calibration operation using the resistor; and
wherein the second impedance control circuit configured, responsive to the calibration command, to sink a current from the terminal before starting the second calibration operation using the resistor.

* * * * *